(12) United States Patent
Rearick et al.

(10) Patent No.: US 6,986,085 B2
(45) Date of Patent: Jan. 10, 2006

(54) SYSTEMS AND METHODS FOR FACILITATING TESTING OF PAD DRIVERS OF INTEGRATED CIRCUITS

(75) Inventors: Jeffrey R. Rearick, Fort Collins, CO (US); John G. Rohrbaugh, Fort Collins, CO (US); Shad Shepston, Firestone, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 534 days.

(21) Appl. No.: 10/094,528

(22) Filed: Mar. 8, 2002

(65) Prior Publication Data

US 2003/0172332 A1    Sep. 11, 2003

(51) Int. Cl.
G01R 31/28 (2006.01)
G01R 31/02 (2006.01)
G01R 31/26 (2006.01)

(52) U.S. Cl. .................. 714/724; 324/763; 324/765
(58) Field of Classification Search ............... 714/724, 714/733, 726, 727, 734, 738, 765; 324/763, 324/765, 537
See application file for complete search history.

(56) References Cited

U.S. PATENT DOCUMENTS

| | | | |
|---|---|---|---|
| 5,371,457 A * | 12/1994 | Lipp | 324/158.1 |
| 5,682,392 A | 10/1997 | Raymond et al. | |
| 5,796,260 A | 8/1998 | Agan | |
| 5,977,775 A | 11/1999 | Chandler et al. | |
| 5,999,008 A * | 12/1999 | Currin et al. | 324/765 |
| 6,275,962 B1 | 8/2001 | Fuller et al. | |
| 6,324,485 B1 | 11/2001 | Ellis | |
| 6,365,859 B1 | 4/2002 | Yi et al. | |
| 6,396,279 B1 | 5/2002 | Gruenert | |
| 6,397,361 B1 | 5/2002 | Saitoh | |
| 2003/0030461 A1 * | 2/2003 | Oberle et al. | 324/765 |

OTHER PUBLICATIONS

Haulin, Tord, "Built-in Parametric Test for Controlled Impedance I/Os," Ericsson Telecom, S-126 25 Stockholm, Sweden, pp. 123-128, Apr. 27-May 1, 1997.

* cited by examiner

Primary Examiner—Guy Lamarre
Assistant Examiner—James C. Kerveros

(57) ABSTRACT

Integrated circuits (ICs) are provided. A representative IC includes a first pad electrically communicating with at least a portion of the IC. The first pad includes a first driver and a first receiver, with the first driver being configured to provide a first pad output signal to a component external to the IC, and the first receiver being configured to receive a first pad input signal from a component external to the IC. The first receiver also is configured to provide, to a component internal to the IC, a first receiver digital output signal in response to the first pad input signal. A first test circuit also is provided that is internal to the IC. The first test circuit is adapted to provide information corresponding to the driver tristate leakage current of the first pad. Methods, computer-readable media, systems and other ICs also are provided.

20 Claims, 12 Drawing Sheets

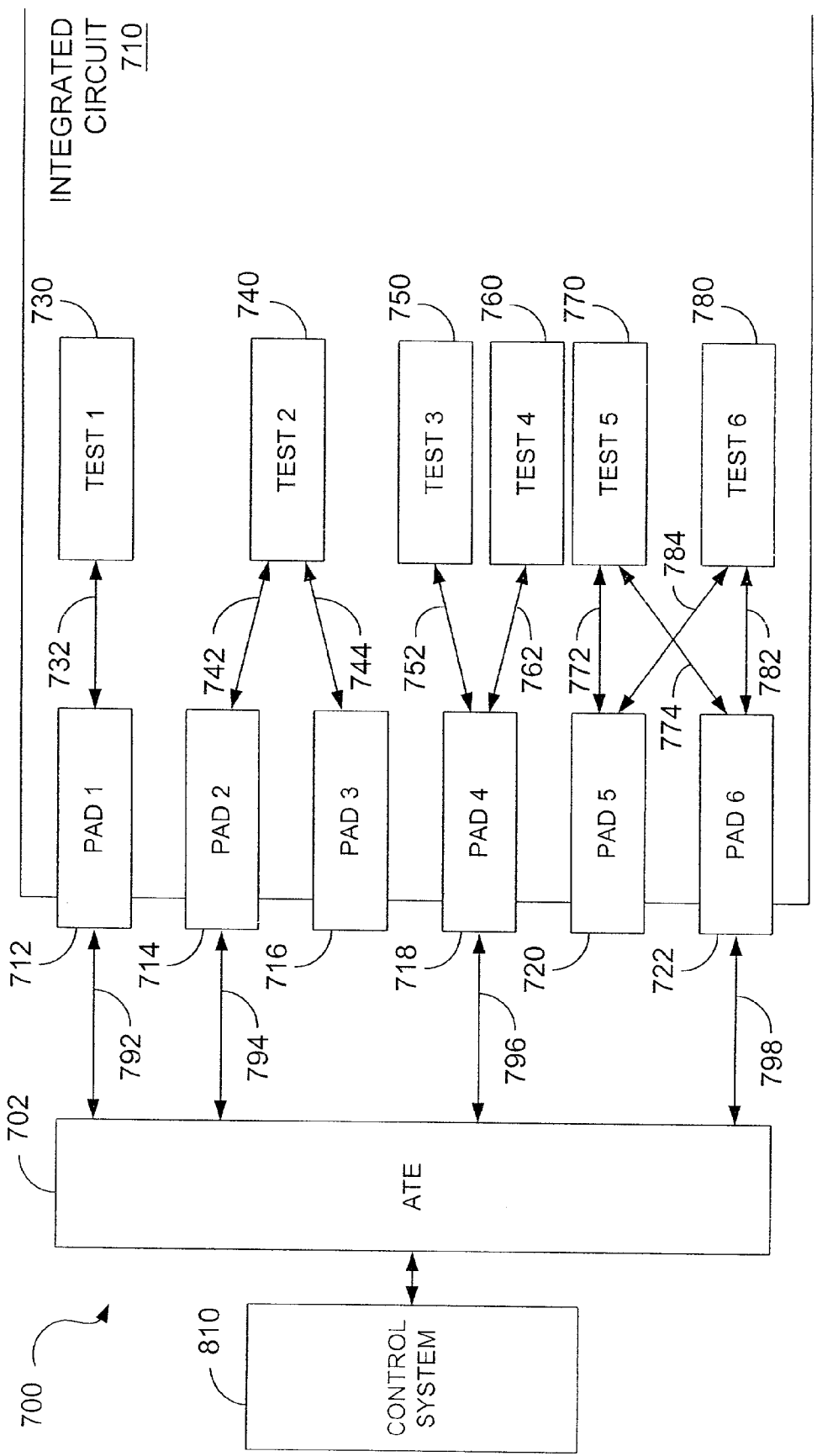

SYSTEMS AND METHODS FOR FACILITATING TESTING OF PAD DRIVERS OF INTEGRATED CIRCUITS

BACKGROUND OF THE INVENTION

1. Field of the Invention

The present invention generally relates to integrated circuits and, in particular, to systems and methods for facilitating, within an integrated circuit, tristate leakage current testing of pads of the integrated circuit.

2. Description of the Related Art

Heretofore, integrated circuit (IC) devices have been tested and verified using a variety of test methods. For example, IC devices have been tested and verified to be defect-free using functional test vectors, such as those applied to the IC by the use of automated test equipment (ATE), which stimulate and verify the IC device functionality at the pin level of the device. A practical limitation to the utilization of ATE for testing IC's, however, is that the number of IC pins (or pads) that can be tested by a particular ATE has, heretofore, been limited by the physical configuration of the ATE. For instance, the number of pads of the IC to be tested may exceed the number of test channels provided by an ATE, or the number of pads may exceed the capacity of the ATE support hardware, such as by exceeding the maximum number of probes on a probe card, among others. As utilized herein, the term "pad" is used to refer collectively to both a physical site, which serves as an electrical contact for an IC, as well as circuitry associated with the physical site for enabling electrical communication between components of the IC and components external to the IC.

Additionally, performance limitations of a particular ATE may impose certain other testing restrictions. For example, the frequency of IC inputs and outputs may exceed the maximum frequency of the ATE, thereby limiting the test frequency of the IC to be tested to the maximum frequency of the ATE. Although configuring an ATE with additional test channels and/or a higher operating frequency may be accomplished, providing an ATE with an appropriately high pin count and/or an appropriately high operating frequency in order to eliminate the aforementioned deficiencies is, oftentimes, cost prohibitive.

In light of the foregoing and/or other deficiencies, it is known in the prior art to test IC devices utilizing a variety of "stop-gap" testing procedures, including: (1) connecting an ATE to less than all of the pins of an IC device; (2) connecting multiple pins of an IC device to a single ATE test channel; (3) testing the IC device in multiple passes of the ATE, with each pass testing a subset of the pins of the entire IC device; (4) testing the device at less than maximum frequency, and; (5) limiting, through design implementation, the pin count and/or frequency of the IC device to accommodate existing ATE, among others. As should be readily apparent, many of these "stop-gap" testing procedures may result in a loss of test coverage and, thereby, may lead to an increase in numbers of defective IC devices being shipped. Moreover, the practice of limiting, through design implementation, the pin count and/or frequency of the IC device to accommodate existing ATE is, oftentimes, an unacceptable constraint on IC design.

Therefore, there is a need for improved systems and methods which address these and/or other shortcomings of the prior art.

SUMMARY OF THE INVENTION

Briefly described, the present invention provides driver tristate testing functionality within integrated circuits. In this regard, some embodiments of the present invention may be construed as providing integrated circuits (ICs). An embodiment of such an integrated circuit (IC) includes a first pad electrically communicating with at least a portion of the IC. The first pad incorporates a first driver and a first receiver, with the first driver being configured to provide a first pad output signal to a component external to the IC. The first receiver is configured to receive a first pad input signal from a component external to the IC and to provide, to a component internal to the IC, a first receiver digital output signal in response to the first pad input signal. The IC also includes a first test circuit internal to the IC. The first test circuit is adapted to provide information corresponding to the driver tristate leakage current of the first pad.

Another embodiment of an IC incorporates a first pad electrically communicating with at least a portion of the IC. The first pad includes a first driver and a first receiver, with the first driver being configured to provide a first pad output signal to a component external to the IC. The first receiver is configured to receive a first pad input signal from a component external to the IC and to provide, to a component internal to the IC, a first receiver digital output signal in response to the first pad input signal. Means for providing information also is included.

Embodiments of the invention also may be construed as providing methods for testing ICs. In this regard, one such embodiment includes: electrically interconnecting automated test equipment (ATE) with the IC; providing at least one stimulus such that the IC measures a driver tristate leakage current of the first pad; and receiving information corresponding to the driver tristate leakage current of the first pad.

Computer-readable media also are provided. In this regard, an embodiment of a computer-readable medium includes a computer program for facilitating driver tristate testing of an IC. The computer-readable medium includes: logic configured to enable automated test equipment (ATE) to provide at least one stimulus to the IC such that the first test circuit provides information corresponding to the driver tristate leakage current of the first pad; and logic configured to enable the ATE to receive, from the first test circuit, the information corresponding to the driver tristate leakage current of the first pad.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

FIG. 7 is a schematic diagram depicting an alternative embodiment of a portion of an integrated circuit, ATE and a control system of the present invention.

DETAILED DESCRIPTION

Figure 1:
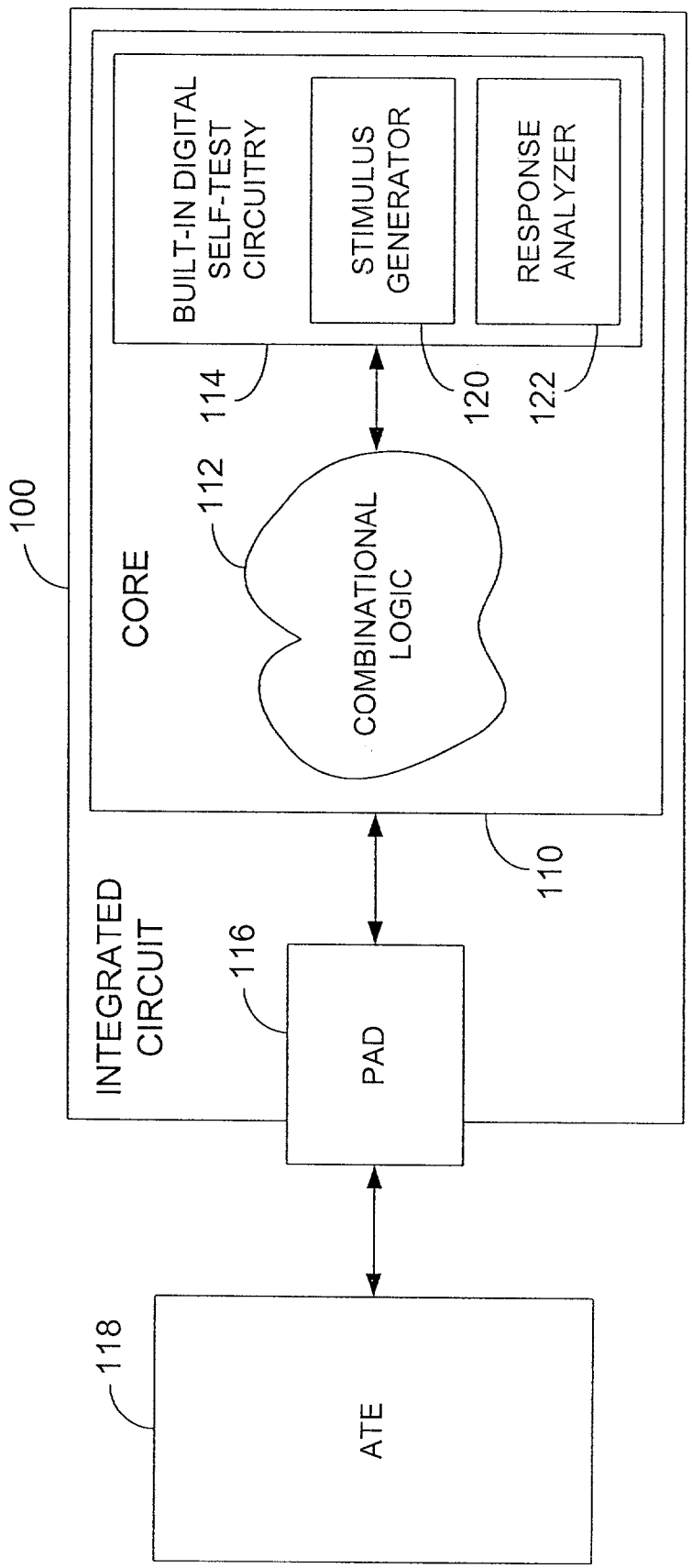
FIG. 1 is a schematic diagram depicting a representative integrated circuit: incorporating digital self-test circuitry of the prior art.

Reference will now be made in detail to the description of the invention as illustrated in the drawings with like numerals indicating like parts throughout the several views. As mentioned briefly hereinbefore, it is known to incorporate built-in (digital) self test circuitry into an integrated circuit. Referring now to FIG. 1, a representative integrated circuit 100 incorporating such built-in self-test circuitry will be described in greater detail.

As shown in FIG. 1, integrated circuit 100 includes a core 110 which incorporates logic 112 and digital self-test circuitry 114. Core 110 electrically communicates with pad 116 which is configured to electrically communicate with devices external to the integrated circuit, such as a piece of automated test equipment (ATE) 118, for example. So configured, signals provided from an external device, e.g., ATE 118, may be delivered to the core 110 via a transmission path which includes pad 116.

As is known, digital self-test circuitry 114 is configured to provide functional-based digital testing of logic circuitry contained within core 110. In order to accomplish such testing, digital self-test circuitry 114 typically incorporates a stimulus generator 120 and a response analyzer 122. More specifically, stimulus generator 120 is configured to provide one or more test patterns for testing logic circuitry of the core.

The pattern or patterns provided to the logic circuitry are comprised of digital data, i.e., zeros and ones. In response to the various patterns, the logic circuitry under test then provides a response signal or signals to the response analyzer 122 which is able to interpret the response and provide a test result signal, which may be provided externally of the integrated circuit. Thus, the digital self-test circuitry provides for digital, functional testing of the core by applying digital test patterns to the logic circuitry of the core and has, heretofore, substantially removed the need for external test equipment, i.e., ATE 118, to provide stimulus to and check responses from the integrated circuit for facilitating testing of the digital logic circuitry.

Figure 2:
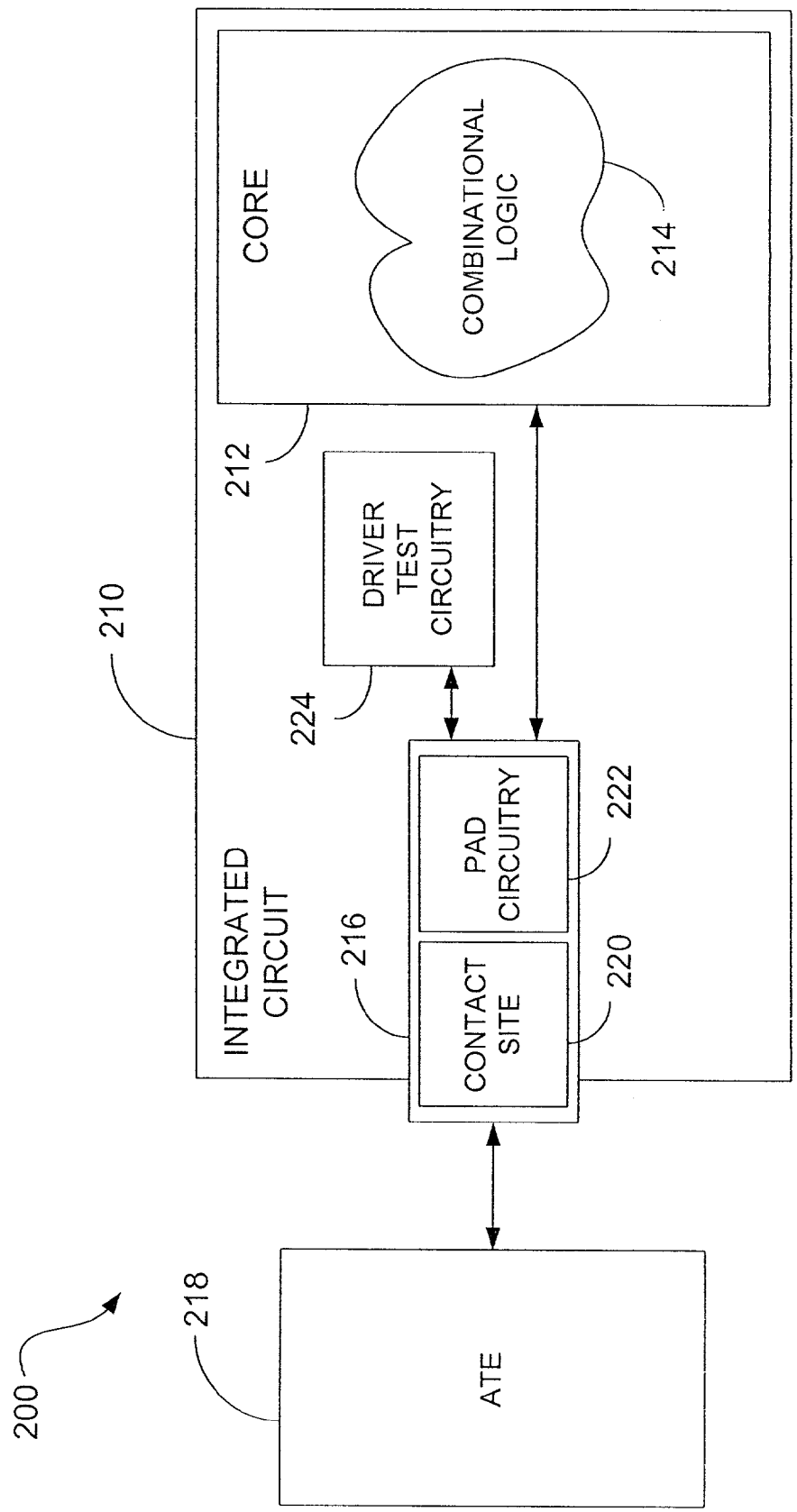
FIG. 2 is a schematic diagram depicting an embodiment of the test system of the present invention that incorporates an integrated circuit and automated test equipment.

Utilizing the digital self-test circuitry of FIG. 1 as a point of comparison, general characteristics of an embodiment of the driver test system of the present invention will now be described in reference to the schematic diagram of FIG. 2. As depicted in FIG. 2, driver test system 200 incorporates an integrated circuit 210 which includes a core 212. Core 212 incorporates logic 214 and electrically communicates with a pad 216, which is configured to allow intercommunication of the logic with devices, such as ATE 218, for example, external to the integrated circuit.

As mentioned hereinbefore, a pad, such as pad 216, includes a physical or contact site 220, which serves as an electrical contact for IC 210, as well as pad circuitry 222, which cooperates with the contact site to enable electrical communication between components of the IC and components external to the IC. As is known, pad circuitry may include one or more of a receiver, for receiving signals provided to the pad, and a driver, for providing signals to external devices.

Additionally, integrated circuit 210 incorporates driver test circuitry 224 which electrically communicates, either directly or indirectly, with pad 216. As described in detail hereinafter, driver test circuitry 224 is configured to provide selected ATE functionality and, thereby, potentially reduces the necessity for specialized external automated test equipment for testing integrated circuits of various configurations. It should be noted that, although driver test circuitry 224 is depicted in FIG. 2 as residing outside core 212 and outside the pad 216, various other arrangements of test circuitry 224 may be utilized, such as arranging the test circuitry within the core or within the pad, for instance. Moreover, the test circuitry may be configured to communicate with the ATE via a pad other than the pad to be tested, i.e., a pad other than pad 216.

As mentioned hereinbefore, ATE typically provides the ability to test a wide variety of integrated circuits. Oftentimes, however, the full testing capability of a given ATE is usually not required to test a specific type of integrated circuit. Additionally, the number of pads of an integrated circuit may exceed the number of test channels of a given ATE, thereby necessitating the use of an ATE with an increased number of tester channels or necessitating the use of less than optimal testing procedures, e.g., testing fewer than all of the pads of an integrated circuit simultaneously, for instance.

By providing driver test circuitry "on-chip," the testing of integrated circuits, such as integrated circuit 210, may be implemented utilizing conventional ATE, whereby test capability not typically provided by the conventional ATE may be provided by the driver test circuitry. So provided, the driver test circuitry has the ability to provide testing capability that a given ATE does not provide, or is not able to provide, while utilizing various capabilities that a given ATE does provide. Thus, testing systems 200 of the present invention may facilitate efficient and effective testing of integrated circuits that draws from at least some of the inherent strengths of conventional ATE, e.g., reduced costs, while providing potentially improved testing performance.

By utilizing the driver test circuitry of the present invention, testable pin count of an integrated circuit is not necessarily limited by the ATE, such as by the tester channel configuration of a given ATE. For instance, the ATE may provide signals, such as scan test signals and resets, for example, to some pads of an integrated circuit under test, while leaving other pads to be tested by the driver test circuitry. Additionally, utilization of the driver test circuitry makes it possible to test the integrated circuits at frequencies greater than the test frequency limit of the ATE.

As mentioned hereinbefore, the present invention facilitates testing of drivers of integrated circuits. In this regard, certain integrated circuit output driver circuits, typically those connected to bidirectional pins or those which will be wired to external pullup or pulldown networks, are capable of being placed in three logic states, i.e., 0, 1, or high impedance (usually denoted as "Z"). Such a driver is shown in the schematic diagram of FIG. 3.

Figure 3:
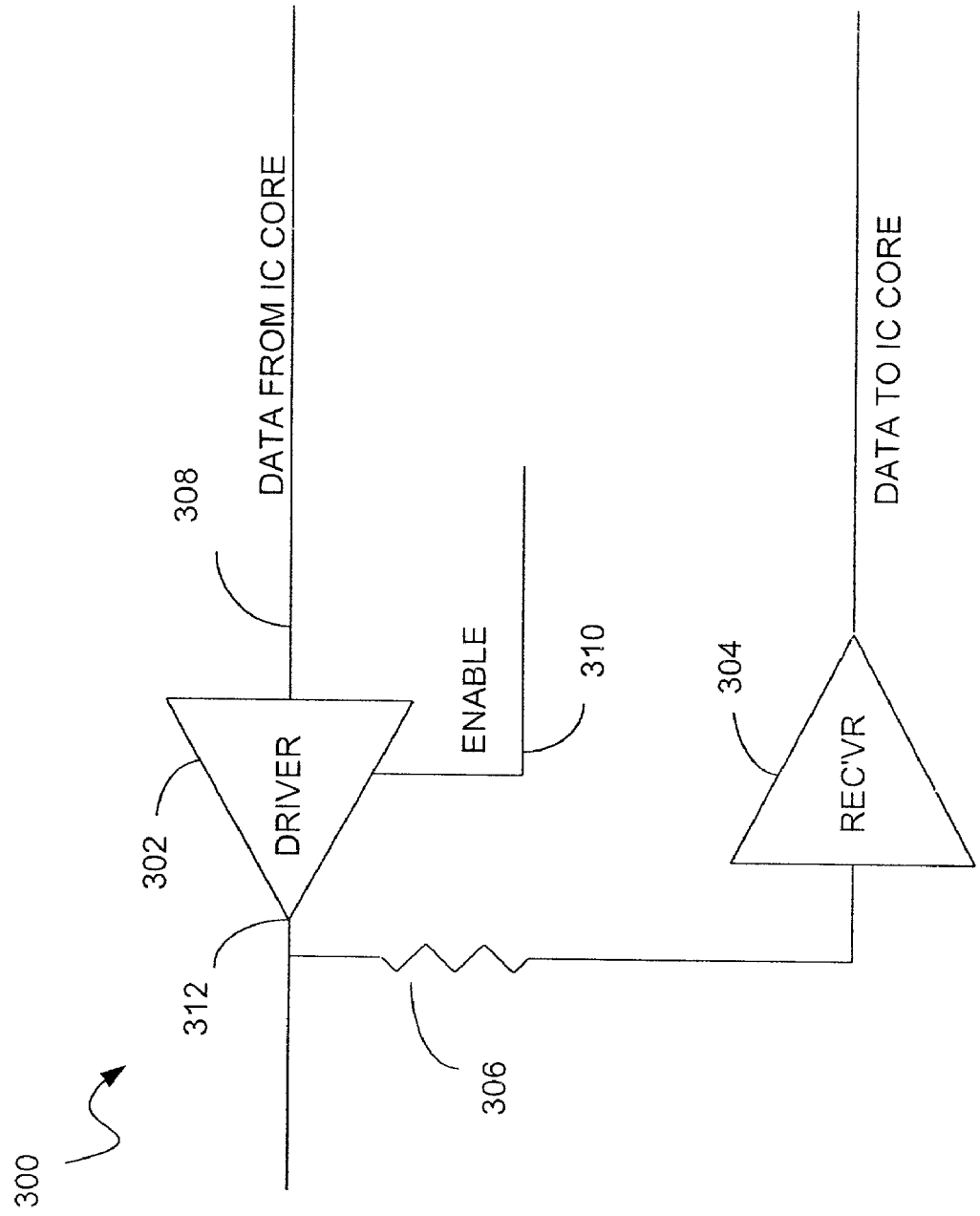
FIG. 3 is a schematic diagram depicting representative pad circuitry that includes a tristate driver and a receiver.

As shown in FIG. 3, pad circuitry 300 includes a driver 302 and a receiver 304. The driver and receiver are electrically coupled with an optional resistor 306 disposed therebetween. Driver 302 has two inputs, i.e., data 308 and enable 310, and one output 312. Driver 300 is known as a "tristate" driver that exhibits the following truth table:

TABLE 1

| enable | data | output |
|--------|------|--------|
| 0 | 0 | Z |
| 0 | 1 | Z |
| 1 | 0 | 1 |
| 1 | 1 | 0 |

To assure proper fabrication and/or operation of tristate drivers, these drivers typically require an additional test over and above that applied to regular two-state {0, 1} drivers. Specifically, verification that the driver can be placed in a high impedance state is usually needed. When such a driver is placed in the high impedance state, it is commonly said to be "tristated." In the ideal case, an infinite impedance would mean there is not current either sourced or sunk by the driver when it is tristated. Thus, the output signal is left floating, i.e., undriven by the tristated driver. Therefore, the voltage value on the output node is free to be determined by a component external to the tristated driver.

In real transistor implementations of the tristate driver circuits, finite impedances imply that the ideal of zero current in the high impedance state cannot be met. In particular, leakage currents inherent in the devices are an impediment. These leakage currents are usually quite small, e.g., on the order of nanoAmperes per Micron of transistor width in deep submicron IC processes, but defectively manufactured transistors can have leakages that are orders of magnitude greater. Since excessive leakage could impair the operation of a system which uses tristate drivers, an acceptable upper bound on leakage typically is specified and tested for during production. Typical automated test equipment (ATE) systems employ nanoammeters in parametric measurement unit (PMUs) that can be connected to a tristated pad to verify that the leakage current is within the specified limit.

Typical pad driver circuits are implemented with one or more transistors that can pull the pad up to the power supply (logic "1"), and one or more transistors that can pull the pad down to ground (logic "0"). In CMOS processes, P-type transistors are usually used to pull up to the positive power supply, and N-type transistors are usually used to pull down to ground.

Figure 4:
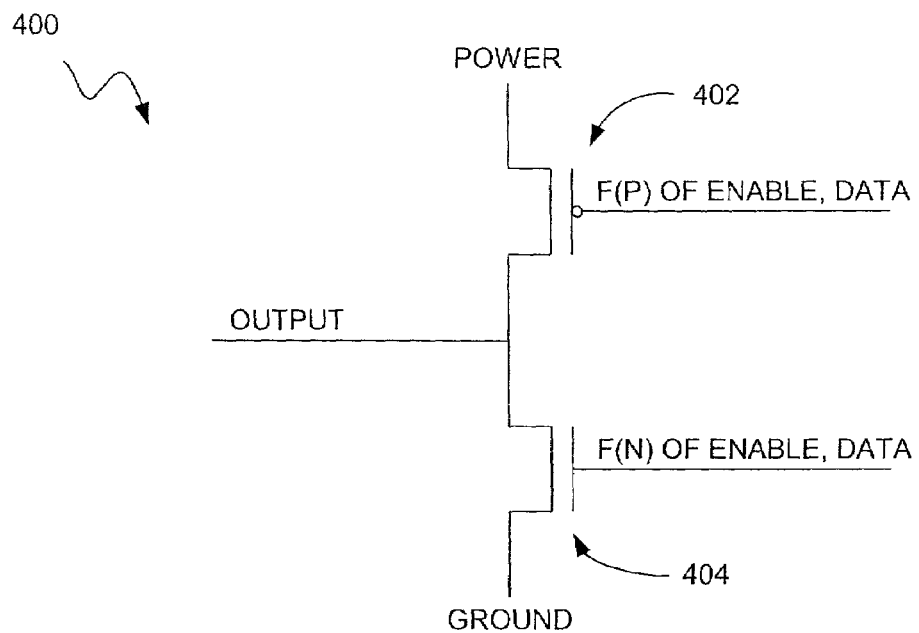
FIG. 4 is a schematic diagram depicting an embodiment of a tristate driver.

An example of such a tristate driver is shown schematically in FIG. 4. As shown in FIG. 4, tristate driver 400 includes a P-type transistor 402 coupled between power and output, and an N-type transistor 404 coupled between output and ground.

The defective leakage phenomenon can happen in either direction, resulting in either unwanted current being sourced through the pullup device(s) or unwanted current being sunk through the pulldown device(s). Thus, a tristate leakage test typically consists of two portions, i.e., one of verifying the high impedance of the pullup device(s) and another verifying the high impedance of the pulldown device(s).

Unfortunately, for ICs with pin counts that exceed the number of available tester channels, ATE cannot be used to measure tristate leakage currents on all pads. The subset of pads which are contacted by the ATE can be tested, but that would leave many other pads untested, risking undetected defects. The present invention potentially solves this problem. In some embodiments, this is accomplished by embedding a tristate leakage measurement circuit within the driver circuit to enable verification that a high impedance state can be achieved to a certain degree of accuracy.

Figure 5:
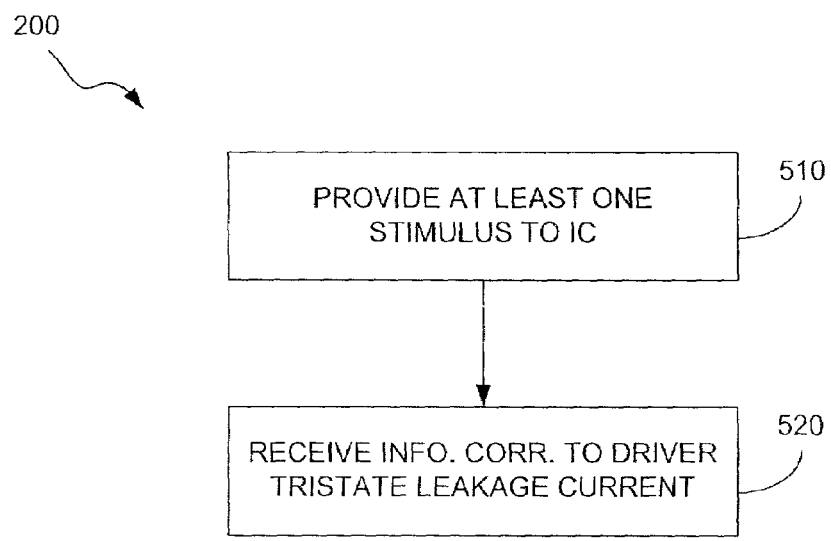
FIG. 5 is a flowchart depicting functionality of an embodiment of the test system of the present invention.

The flowchart of FIG. 5 shows the functionality of an implementation of the present invention. In this regard, the functions noted in the various blocks may occur out of the order depicted in FIG. 5 or in any other of the accompanying flowcharts. For example, functionality associated with two blocks shown in succession in FIG. 5 may occur substantially concurrently. In some embodiments, the functionality may occur in the reverse order.

As shown in FIG. 5, the test system or method 200 depicted may be construed as beginning at block 510, where at least one stimulus is provided to the IC such that the IC measures a driver tristate leakage current of a first pad. In block 520, information corresponding to the driver tristate leakage current of the first pad is received. By way of example, the information can be received by ATE that is electrically interconnected to at least some of the pads of the IC.

Figure 6A:
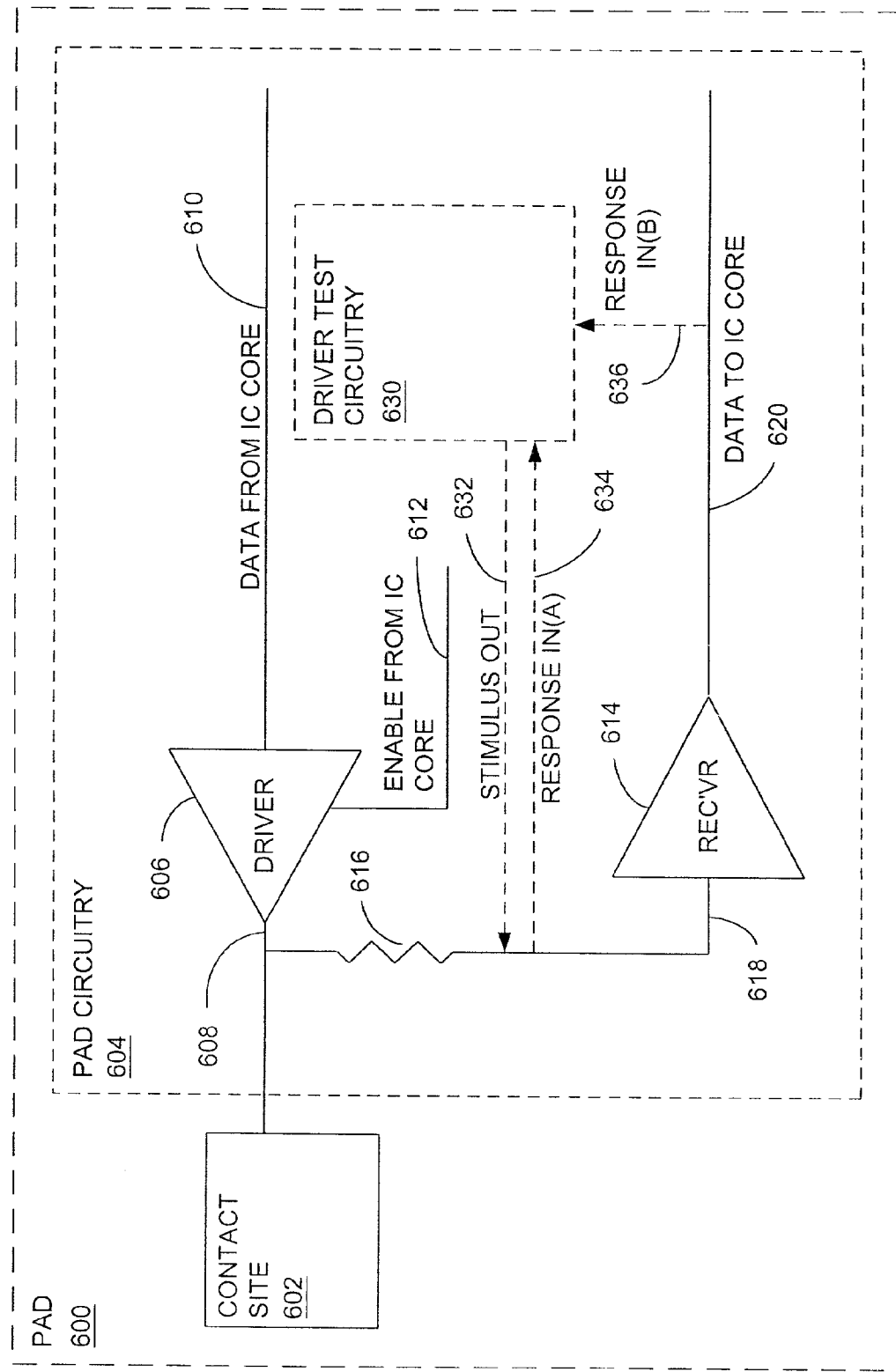
FIG. 6A is a schematic diagram depicting a portion of an integrated circuit that includes an embodiment of driver test circuitry of the present invention.

Reference will now be made to FIG. 6A, which depicts an embodiment of an IC of the present invention. As shown in FIG. 6A, a pad 600 of an integrated circuit includes both a contact site, e.g., contact site 602, and pad circuitry associated with the contact site, e.g., pad circuitry 604. Circuitry 604 includes a driver 606, which can be a tristate driver, that electrically communicates with the contact site 602, such as by lead 608. Driver 606 is configured to receive a data signal 610 from the IC core and a driver enable signal 612 from the IC core. Driver 606 also is electrically interconnected to a receiver 614 with an optional resistor 616 being coupled therebetween. Receiver 614 is configured to receive an input, such as via lead 618, and is configured to provide an output, such as via lead 620, to the IC core of the integrated circuit.

FIG. 6A also depicts an embodiment of driver test circuitry 630 of the present invention. More specifically, driver test circuitry 630 is configured to communicate with the driver output/receiver input, depicted by arrows 632 and 634, and/or with the receiver output, depicted by arrow 636. As will be described later, driver test circuitry 630 is configured to verify that driver 606 can be tristated.

Figure 6B:
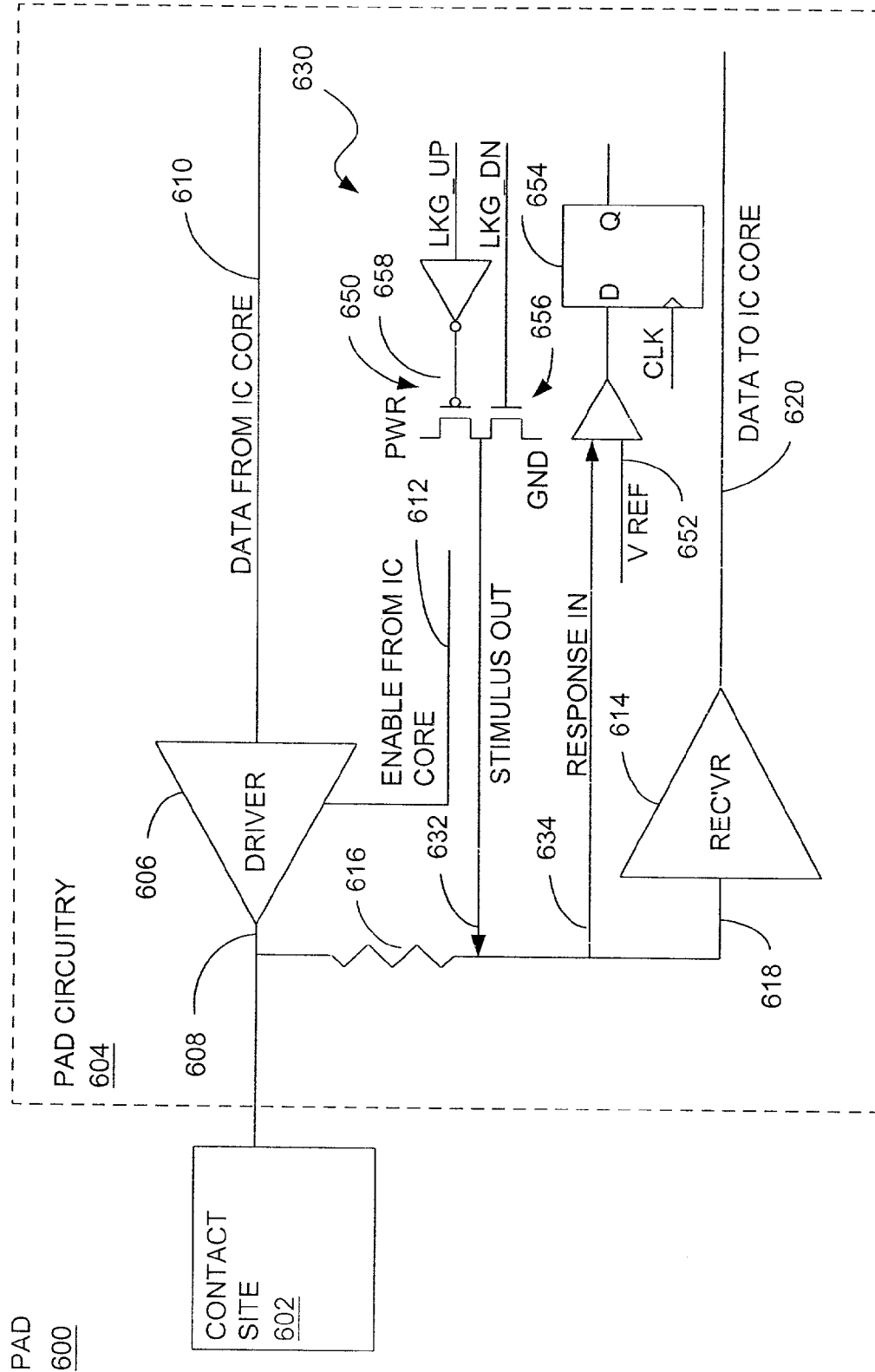
FIG. 6B is a schematic diagram depicting a portion of an integrated circuit incorporating an embodiment of the driver test circuitry of the present invention.

Referring now to FIG. 6B, another embodiment of driver test circuitry 630 will be described in greater detail. As depicted in FIG. 6B, driver test circuitry 630 is based on a simple ratioed-logic circuit. More specifically, a small transistor (either p-type transistor 650 or n-type transistor 656) is activated to oppose the tristated driver's leakage current, and the resulting voltage is compared to a reference 652, with the result of the comparison being captured in a scan register 654 for later observation.

To test the tristate leakage current of the driver's pullup device(s), the driver's output is initialized to a "1" by setting enable and data to "1." Then, the driver's data input is kept at "1" while the enable signal is set to "0." A pulldown type transistor 656 is activated by a test signal ("lkg_dn") tied to its gate. This n-type type transistor is sized such that its on-resistance is less than the off-resistance of the large p-type driver transistor(s), as quantified by the tristate leakage current specification. Thus, if the p-type driver is truly in the high impedance state, the lkg_dn pulldown transistor (656) will be sufficient to pull the output node to a logic "0." If, however, the p-type driver is not in the high impedance state, or if a defect is present that causes excessive leakage, then the lkg_dn pulldown transistor will be insufficient to pull the output node down. Therefore, an incorrect logic "1" value will be sampled on the output node.

To test the tristate leakage current of the driver's pulldown device(s), the driver's output is initialized to "0" by setting enable to "1" and data to "0." Then, the driver's data input is kept at "0" while the enable signal is set to "0." A pullup p-type transistor 658 is activated by the inverse of a test signal ("lkg_up") tied to its gate. This p-type transistor is sized such that its on-resistance is less than the off-resistance of the large n-type driver transistor(s), as quantified by the tristate leakage current specification. Thus, if the n-type driver is truly in the high impedance state, the lkg_up pullup transistor (650) will be sufficient to pull the output node to a logic "1." If, however, the n-type driver is not in the high impedance state, or if a defect is present that causes excessive leakage, then the lkg_up pullup transistor will be insufficient to pull the output node up. Therefore, an incorrect logic "0" value will be sampled on the output node.

Figure 6C:
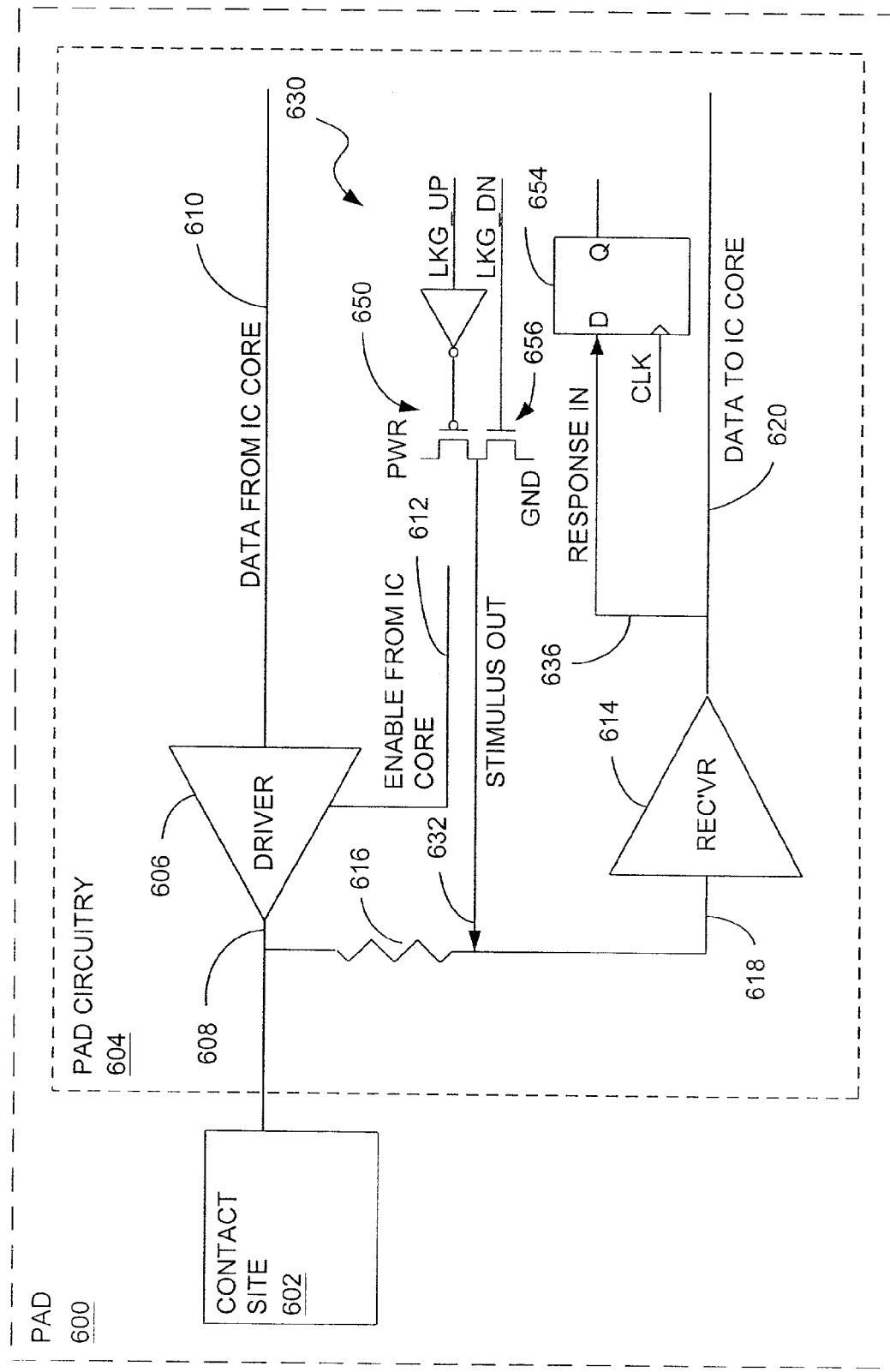
FIG. 6C is a schematic diagram depicting a portion of an integrated circuit incorporating an embodiment of the driver test circuitry of the present invention.

In some implementations, the receiver circuit associated with the tristate driver circuit is used as the comparator so as not to incur any additional area penalty. FIG. 6C is a schematic diagram depicting such an implementation. In this configuration, the scan register 654 associated with the receiver is used to capture the receiver output. Since each receiver typically has its own scan register (as per IEEE standard 1149.1), all the pads can be tested simultaneously.

Figure 6D:
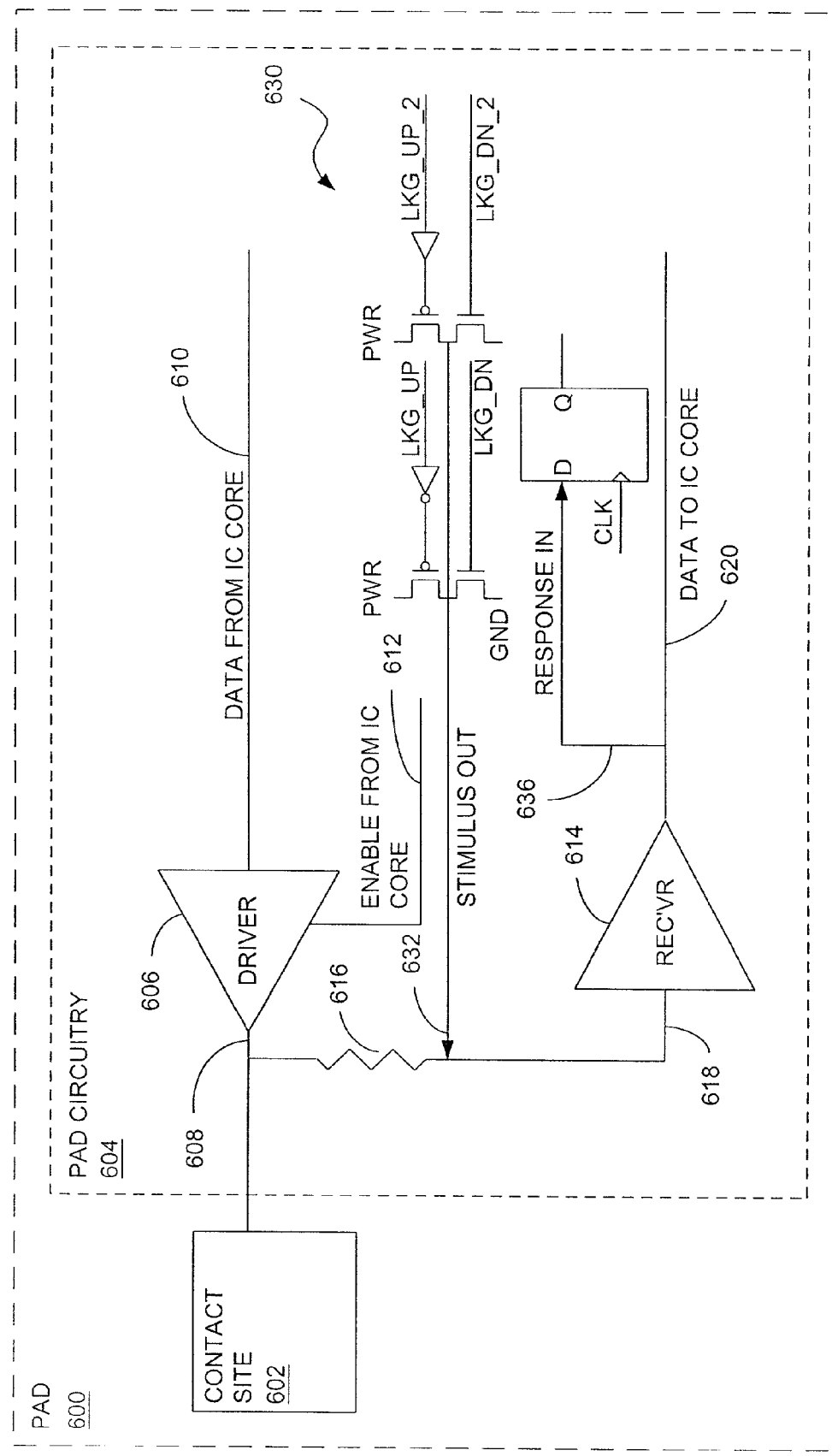
FIG. 6D is a schematic diagram depicting a portion of an integrated circuit incorporating an embodiment of the driver test circuitry of the present invention.

Note, the previous circuit(s) identify when a driver tristate leakage current is above a specifies value(s), as codified by the size of the lkg_dn and the lkg_up transistors, which can be logged as a test failure. The current measurement circuit can be extended to allow the failure threshold to be changed, which allows adjustment of the preset tristate leakage current failure limit, as well as allowing a range of values of defective tristate leakage currents to be measured. This can be done by adding additional pairs of lkg_up and lkg_dn transistors, such as in parallel to the original set or in series with the original set. Additionally, each set can include unique control signals (lkg_up_2 and lkg_dn_2, for example), as shown in FIG. 6D.

Note, that the sizing of each pair of lkg_up and lkg_dn transistors can be unique and specifically weighted such that turning on various combinations can allow a wide variety of current threshold measurements. For example, if three pairs of parallel transistors are used, and the sizes of each pair are a factor of two greater than the previous pair, and the first pair is sized to source/sink 1 $\mu$A, then the following eight pairs of measurement thresholds can be achieved:

| 1 kg_dn_3 | 1 kg dn_2 | 1 kg_dn_1 | current_threshold |
|---|---|---|---|
| 0 | 0 | 0 | off: normal operation |
| 0 | 0 | 1 | +1 $\mu$A |
| 0 | 1 | 0 | +2 $\mu$A |
| 0 | 1 | 1 | +3 $\mu$A |
| 1 | 0 | 0 | +4 $\mu$A |
| 1 | 0 | 1 | +5 $\mu$A |
| 1 | 1 | 0 | +6 $\mu$A |
| 1 | 1 | 1 | +7 $\mu$A |

| 1 kg_up_3 | 1 kg_up_2 | 1 kg_up_1 | current_threshold |
|---|---|---|---|
| 0 | 0 | 0 | off: normal operation |
| 0 | 0 | 1 | −1 $\mu$A |
| 0 | 1 | 0 | −2 $\mu$A |
| 0 | 1 | 1 | −3 $\mu$A |
| 1 | 0 | 0 | −4 $\mu$A |
| 1 | 0 | 1 | −5 $\mu$A |
| 1 | 1 | 0 | −6 $\mu$A |
| 1 | 1 | 1 | −7 $\mu$A |

It should be understood that the positive current thresholds represent the p-type transistors(s) in the pad driver sourcing current, and the negative current thresholds represent the n-type transistor(s) in the pad driver circuit sinking current. It should also be clear that only one type of measurement (sourcing or sinking) can be made at any given time and that the control signals for the other sense should be held in their inactive state. For example, if any one or more of the three lkg_dn control signals is active, i.e., set to "1", then all three of the lkg_up control signals should be off, i.e., set to "0".

When an IC has a high pin count, it is overwhelmingly likely that there are many occurrences of the same pad driver circuit type used for different signals. The present invention can make use of that fact to assess the accuracy of the tristate leakage measurement circuit. If one signal connected to a given pad driver circuit type is contacted by the ATE, the nanoammeter in the PMU of the ATE can be used to accurately measure the current sourcing and sinking abilities of the lkg_up and lkg_dn transistors, respectively. These values will be largely identical for all other copies of this pad type, subject only to the variation of the IC process, which tends to be small in any given area of the circuit. Thus, for a group of pad driver circuits of a given type that are near each other in the circuit, the measurement of one ATE-contacted member can be used to reliably infer the values for the other non-contacted members, thereby allowing the pass/fail results from the scan registers sampling the pad voltages of non-contacted pads to represent actual current specification values.

In FIG. 7, an embodiment 700 of the present invention is depicted that can be used to implement the aforementioned functionality. As shown in FIG. 7, system 700 incorporates an integrated circuit 710 which includes multiple pads. In particular, integrated circuit 710 includes pads 1 through 6 (712, 714, 716, 718, 720, and 722, respectively). The integrated circuit also incorporates various receiver test circuits, such as Test 1 (730), Test 2 (740), Test 3 (750), Test 4 (760), Test 5 (7'70) and Test 6 (780). The various driver test circuits electrically communicate with their respective pads in a variety of configurations. For instance, circuitry 730 communicates directly with pad 712 via transmission path 732 (in an implementation, path 732 may be two unidirectional paths); circuitry 740 communicates with each of pads 714 and 716 by utilizing transmission paths 742 and 744 respectively; circuitry 750 and circuitry 760 each electrically communicate with pad 718 via transmission paths 752 and 762 respectively; circuitry 770 communicates with pads 720 and 722 via transmission path 772 and 774 respectively; and circuitry 780 also communicates with pads 720 and 722 albeit, via transmission path 782 and 784 respectively. Thus, an integrated circuit may incorporate various pad types as well as various configurations of intercommunication between the various pads and various driver test circuits.

As an illustrative example, and not for the purpose of limitation, an integrated circuit may be configured to utilize one driver test circuit to test multiple pads, e.g., utilizing one driver test circuit to test multiple pads of like type. Such a configuration is represented schematically in FIG. 7 by Pad 2 and Pad 3, which are both tested by Test 2. As another example, one or more of the pads may not communicate with ATE either directly, or indirectly via one or more of the driver test circuits.

As shown in FIG. 7, ATE 702 electrically communicates with the test circuitry of integrated circuit 710 by utilizing a variety of transmission path configurations. For example, circuitry 730 communicates with the ATE via transmission path 732, pad 712 and transmission path 792; circuitry 740 communicates with the ATE via transmission path 742, pad 714 and transmission path 794; circuitry 750 communicates with the ATE via transmission path 752, pad 718 and transmission path 796; circuitry 760 communicates with the ATE via transmission path 762, pad 718 and transmission path 796; circuitry 770 communicates with the ATE via transmission path 774, pad 722 and transmission path 798; and circuitry 780 communicates with the ATE via transmission path 782, pad 722 and transmission path 798. Additionally, various functionality may be enabled by control system 810 (described in detail hereinafter).

As described hereinbefore, the present invention is adapted to facilitate automated test equipment functionality for testing integrated circuits. In this regard, some embodiments of the present invention may be construed as providing driver test systems for testing integrated circuits. More specifically, some embodiments of the driver test system may include one or more driver test circuits in combination with ATE, e.g., ATE 702 of FIG. 7, and a suitable control system, which may be implemented by control system 810, for example. Such a control system may be implemented in hardware, software, firmware, or a combination thereof. In some embodiments, however, the control system is implemented as a software package, which can be adaptable to run on different platforms and operating systems as shall be described further herein. In particular, an embodiment of the control system, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer-readable medium can be, for example, but is not limited to, an electronic, magnetic, optical, electromagnetic, infrared, or semi-conductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM)(magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Figure 8:
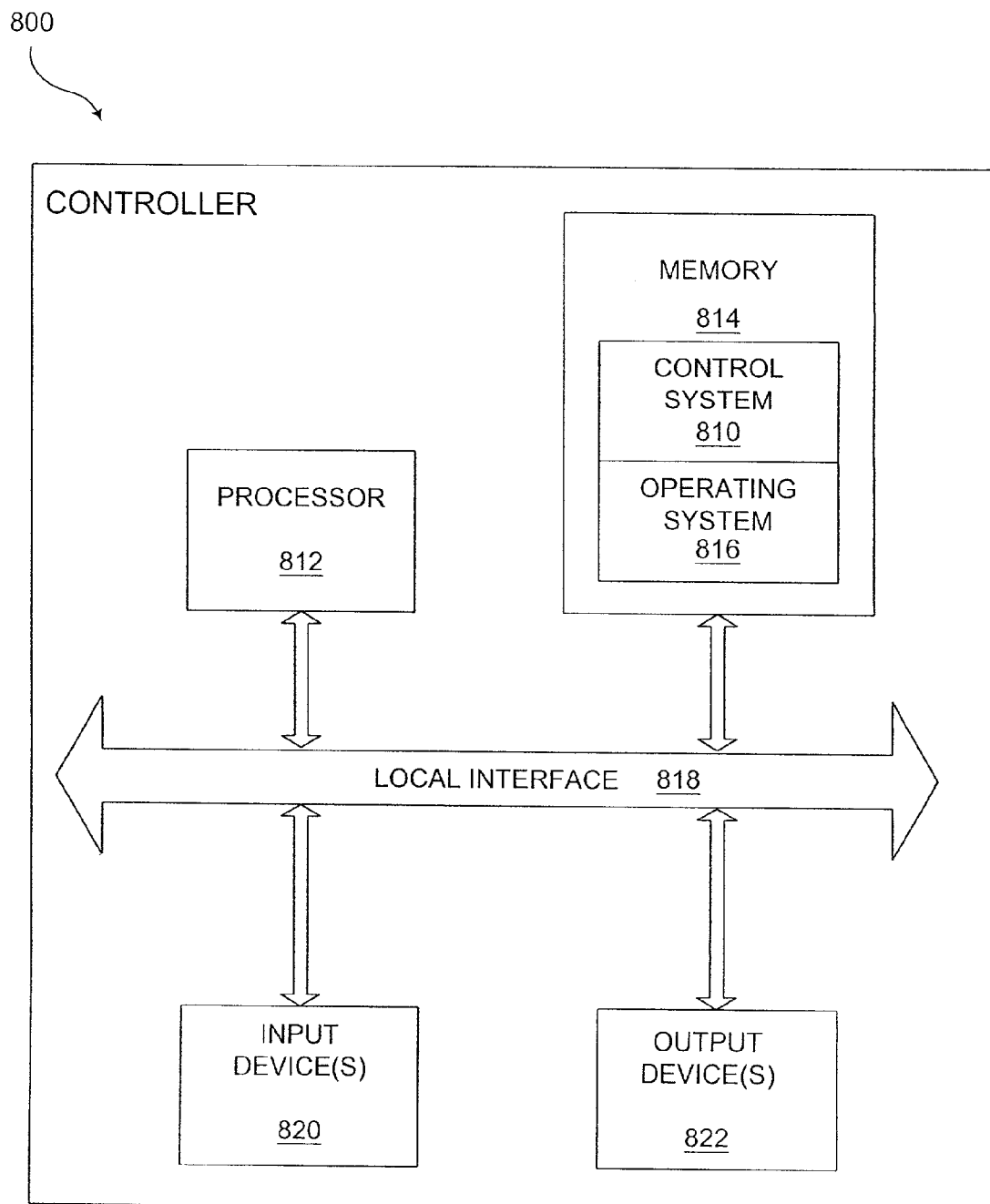
FIG. 8 is a schematic diagram depicting a representative computer or processor-based system that can be used to implement an embodiment of the control system of the present invention.

FIG. 8 illustrates a typical computer or processor-based system 800 which may facilitate functionality of the control system 810 (described in detail hereinafter) of the present invention. As shown in FIG. 8, the computer system generally comprises a processor 812 and a memory 814 with an operating system 816. Herein, the memory 814 may be any combination of volatile and nonvolatile memory elements, such as random access memory or read only memory. The processor 812 accepts instructions and data from memory 814 over a local interface 818, such as a bus(es). The system also includes an input device(s) 820 and an output device(s) 822.

Examples of input devices may include, but are not limited to, a serial port, a scanner, or a local access network connection. Examples of output devices may include, but are not limited to, a video display, a Universal Serial Bus, or a printer port. Generally, this system may run a number of different platforms and operating systems. The control system 810 of the present invention, the functions of which shall be described hereinafter, resides in memory 814 and is executed by the processor 812.

Figure 9:
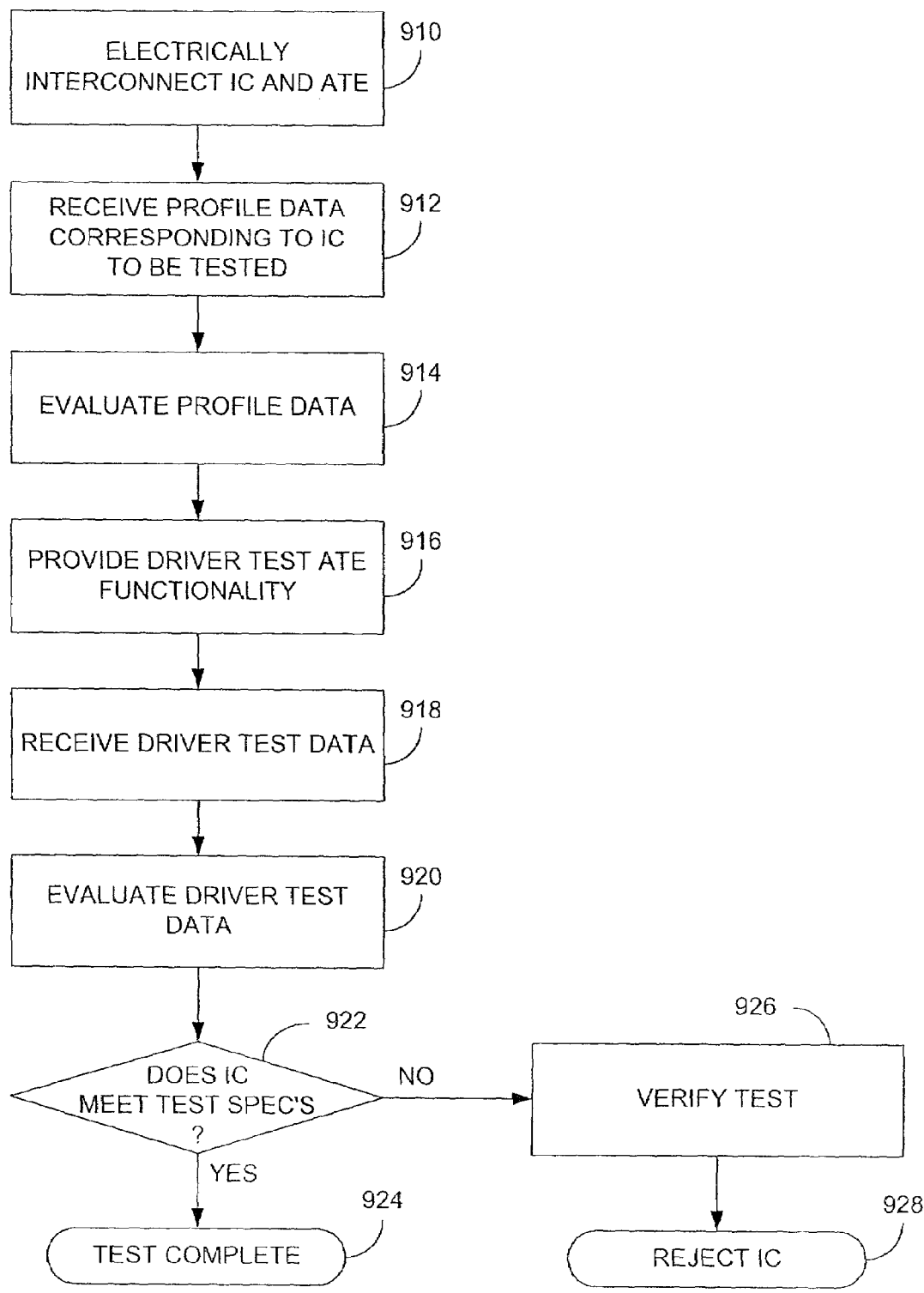
FIG. 9 is a flowchart depicting functionality of an embodiment of the present invention.

The flowchart of FIG. 9 shows the functionality and operation of an implementation of the control system 810 depicted in FIG. 8.

As depicted in FIG. 9, the control system 810 (or method) may be construed as beginning at block 910 where an IC to be tested is electrically interconnected with ATE. Proceeding to block 912, profile data corresponding to the IC to be tested may be received. Such profile data may include, but is not limited to, information relating to the type of IC and/or electrical continuity information corresponding to the interconnection of the ATE and the IC, among others. The profile data may be provided in numerous manners, such as by being provided in the form of an operator input at a work station or as a response to a test initiation signal delivered to the analog test circuitry by the ATE, for instance. After receiving the profile data, if applicable, the process preferably proceeds to block 914 where the data is evaluated, i.e., a determination is made as to whether testing may proceed.

At block 916, the IC under test is provided, by the ATE, with appropriate signals to facilitate driver testing. At block 918, test data is received, such as by the ATE, with the data being received in any suitable manner, e.g., intermittently throughout the testing cycle, or after testing has been completed. At block 920, where driver data is evaluated and, then, in block 922, a determination may be made as to whether the driver, and its associated components, are functioning as desired. If it is determined that the driver is not functioning as desired, the process may proceed to block 926 where the test results may be verified, such as by repeating at least some of the aforementioned process steps 910–922. Thereafter, if the determination once again is made that the integrated circuit is not functioning as desired, the process may proceed to block 928 where the integrated circuit may be rejected. If, however, it is determined that the integrated circuit is functioning as desired, the process may proceed to block 924 where the process may terminate.

As is known, when ATE is used to test an integrated circuit, the ATE should be calibrated to ensure that it is providing accurate measurements. As the present invention provides at least selected ATE functionality, calibration of the driver test circuitry also should be performed. Typical prior art solutions for addressing the issues of calibration have included: using external references for calibration; designing test circuitry to be self-calibrating; designing test circuitry to be invariant to process, voltage, and temperature (PVT); and not calibrating the test circuitry at all. In regard to self-calibrating test circuitry, such a technique potentially causes the disadvantage of increasing the size of the test circuitry to a size where use of such circuitry within an integrated circuit is no longer practical. In regard to designing the test circuitry to be invariant to PVT, providing such invariance is effectively not possible. For instance, heretofore, a typical solution has been to make any PVT variance easily characterizable and predictable. Additionally, this technique also may cause the size of the circuitry to increase to a point where its use is no longer practical. In regard to deliberately failing to calibrate test circuitry, obviously, such a technique may result in test circuitry producing inaccurate results which may lead to an increase in the number of improperly functioning integrated circuits being shipped or may cause an increase in the number of properly functioning integrated circuits which are rejected from being shipped.

Figure 10:
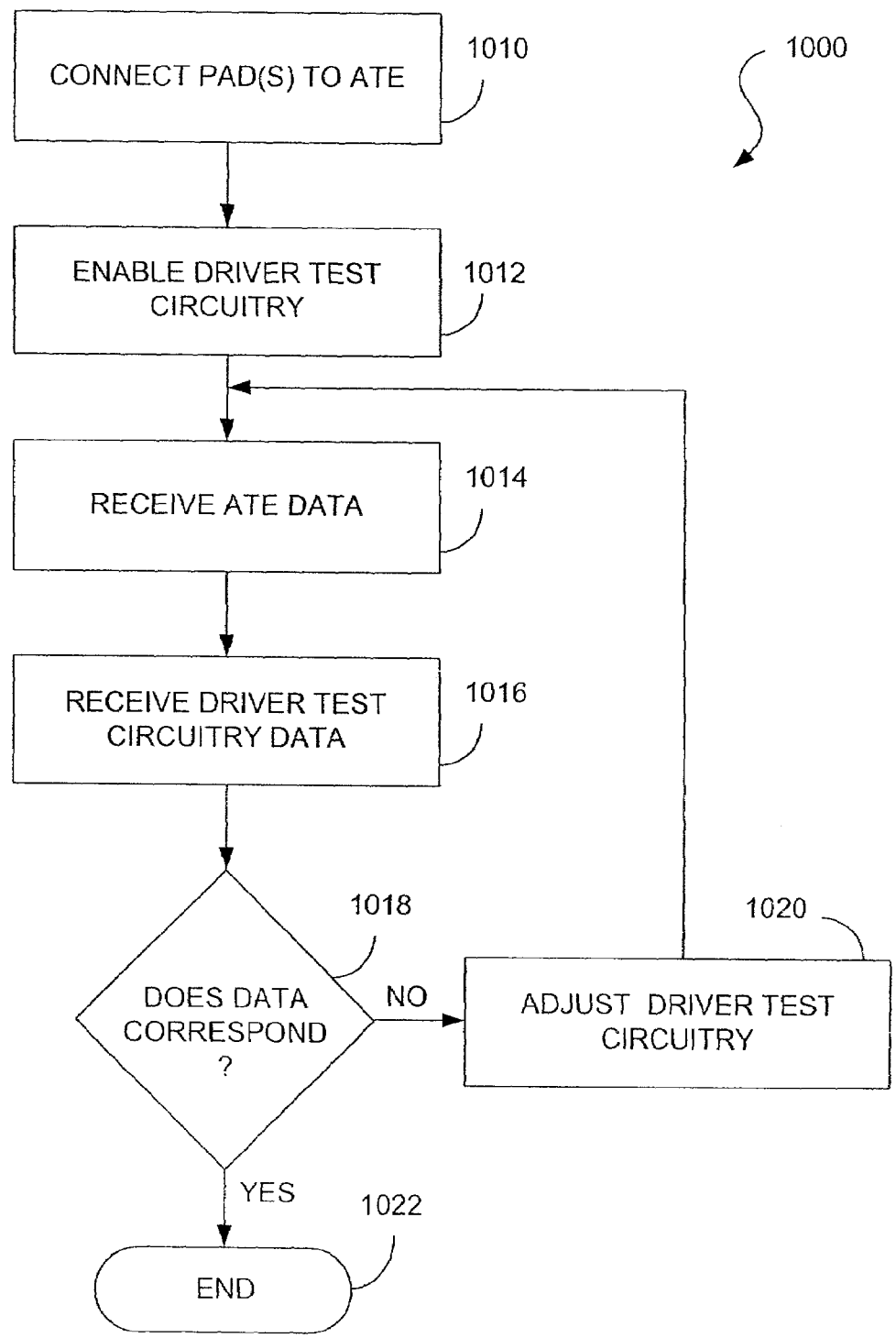
FIG. 10 is a flowchart depicting functionality of an embodiment of the present invention.

Since it is preferable to calibrate the driver test circuitry of the present invention, the following calibration method is provided for the purpose of illustration, and not for the purpose of limitation. As shown in FIG. 10, a method 1000 for calibrating driver test circuitry preferably begins at block 1010 where designated pads of an integrated circuit to be tested are connected to ATE. Preferably, when a circuit design, e.g., a pad, is used multiple times within an IC, identical driver test circuitry can be associated with each instance of that circuit design. When so configured, connecting of the pads to the ATE, such as depicted in block 1010, preferably includes merely connecting the ATE to one or more instances of the circuit design. Since different instances of the repeated circuit design are assumed to be nearly identical in their defect-free electrical behavior, measurements made on the ATE-connected instance of the circuit design may be assumed to correlate to the measurements made at other instances of that circuit design. It should be noted, however, that since each identical instance of the block is assumed to have identical defect-free electrical behavior, only one non-connective pad of each pad type need be utilized, although additional ones of the pads may be utilized for added error detection and comparison.

Proceeding to block 1012, driver test circuitry is enabled. With both ATE and the appropriate driver test circuitry now enabled, measurements can be obtained. Thus, as depicted in blocks 1014 and 1016, the process includes the steps of receiving ATE measurements and receiving driver test circuitry measurements, respectively. At block 1018, a determination may be made as to whether the ATE measurement data and the driver test circuitry data appropriately correspond, thereby indicating proper calibration of the driver test circuitry. If, however, it is determined that the measurements do not correspond, the process may proceed to block 1020 where the driver test circuitry measurements may be adjusted to match those measurements obtained from the ATE. Thereafter, the process may proceed back to block 1014 and proceed as described hereinbefore until the driver test circuitry measurements are appropriately calibrated. Once appropriate calibration has been achieved, the process may end, such as depicted in block 1022.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A method for testing an integrated circuit (IC), the IC having a first pad configured as a signal interface for components external to the IC, the first pad having a driver configured to receive a digital signal from a component internal to the IC and to provide a signal in response thereto, said method comprising:

electrically interconnecting automated test equipment (ATE) with the IC;

providing at least one stimulus such that the IC measures a driver tristate leakage current of the first pad; and receiving information corresponding to the driver tristate leakage current of the first pad.

2. The method of claim 1, wherein providing at least one stimulus comprises:

providing the at least one stimulus from the ATE.

3. The method of claim 1, wherein providing at least one stimulus comprises:

configuring the driver in a tristated condition; and determining whether an output of the driver corresponds to a first value.

4. The method of claim 1, wherein the IC has a plurality of pads, and wherein electrically interconnecting automated test equipment (ATE) with the IC comprises electrically interconnecting the ATE to a subset of the plurality of pads.

5. The method of claim 3, wherein determining comprises:

providing a first pulldown transistor;

inputting a logic "1" at the driver;

tristating the driver;

receiving the output of the driver at the first pulldown transistor; and determining whether an output of the first pulldown transistor is a logic "0" such that if the output of the first pulldown transistor is a logic "0," the tristate leakage current of the driver is not excessive.

6. The method of claim 5, wherein the first pulldown transistor has an on-resistance less than that of the off-resistance of the driver.

7. The method of claim 3, wherein determining comprises:

providing a first pullup transistor;

inputting a logic "0" at the driver;

tristating the driver;

receiving the output of the driver at the first pullup transistor; and determining whether an output of the first pullup transistor is a logic "1" such that if the output of the first pulldown transistor is a logic "1," the tristate leakage current of the driver is not excessive.

8. The method of claim 7, wherein the first pullup transistor has an on-resistance less than that of the off-resistance of the driver.

9. The method of claim 1, further comprising:
calibrating the information using the ATE.

10. The method of claim 1, wherein the driver of the first pad is associated with multiple transistors; and
further comprising:
determining a range within which the driver tristate leakage current resides by iteratively employing the multiple transistors.

11. The method of claim 10, wherein at least some of the multiple transistors are communicatively coupled to each other in at least one of parallel and series.

12. An integrated circuit (IC) comprising:
a first pad electrically communicating with at least a portion of said IC, said first pad having a first driver and a first receiver, said first driver being configured to provide a first pad output signal to a component external to said IC, said first receiver being configured to receive a first pad input signal from a component external to said IC and to provide, to a component internal to said IC, a first receiver digital output signal in response to the first pad input signal; and
a first test circuit internal to said IC and being configured to provide information corresponding to the driver tristate leakage current of the first pad.

13. The IC of claim 12, wherein said first test circuit is configured to receive at least one stimulus from automated test equipment (ATE) such that, in response thereto, said first test circuit provides a data signal to said first receiver of said first pad.

14. The IC of claim 12, wherein said first test circuit has a first pulldown transistor electrically communicating with said driver, said first pulldown transistor being configured to receive an output from said driver.

15. The IC of claim 12, wherein said first test circuit has a first pullup transistor electrically communicating with said driver, said first pullup transistor being configured to receive an output from said driver.

16. An integrated circuit (IC) comprising:
a first pad electrically communicating with at least a portion of said IC, said first pad having a first driver and a first receiver, said first driver being configured to provide a first pad output signal to a component external to said IC, said first receiver being configured to receive a first pad input signal from a component external to said IC and to provide, to a component internal to said IC, a first receiver digital output signal in response to said first pad input signal; and
means for providing information corresponding to the driver tristate leakage current of the first pad.

17. The IC of claim 16, wherein said means for providing information includes:
means for providing a data signal to said driver; and
means for receiving an output of said driver.

18. A system for measuring tristate leakage currents of drivers of an integrated circuit, said system comprising:
automated test equipment (ATE) configured to electrically interconnect with an IC and to provide at least one stimulus to the IC; and
an integrated circuit (IC) having a first pad, said first pad having a first driver, a first receiver and a first test circuit, said first driver being configured to provide a first pad output signal to said ATE, said first receiver being configured to receive a first pad input signal from said ATE and to provide, to a component internal to said IC, a first receiver digital output signal in response to said first pad input signal, said first test circuit being configured to electrically communicate with said ATE such that, in response to receiving said at least one stimulus from said ATE, said first test circuit provides information, corresponding to the driver tristate leakage current of said first pad, to said ATE.

19. The system of claim 18, wherein said IC has a plurality of pads, said ATE is configured to electrically interconnect with a subset of said plurality of pads, and said system is configured to measure the tristate leakage current of each driver of each of said plurality of pads while said ATE is electrically interconnected with said subset of pads.

20. A computer readable medium having a computer program for facilitating driver tristate testing of an integrated circuit (IC), the IC having a first pad and a first test circuit, the first pad being configured as a signal interface for components external to the IC, the first pad having a receiver configured to receive a signal from a component external to the IC and to provide a digital signal in response thereto, the first test circuit being internal to the IC and being configured to provide information corresponding to the driver tristate leakage current of the first pad, said computer readable medium comprising:
logic configured to enable automated test equipment (ATE) to provide at least one stimulus to the IC such that the first test circuit provides information corresponding to the driver tristate leakage current of the first pad; and
logic configured to enable the ATE to receive, from the first test circuit, the information corresponding to the driver tristate leakage current of the first pad.

* * * * *